(12) United States Patent
Kim et al.

(10) Patent No.: US 11,468,952 B2
(45) Date of Patent: Oct. 11, 2022

(54) MEMORY CONTROLLER, MEMORY DEVICE AND STORAGE DEVICE

(71) Applicant: SAMSUNG ELECTRONICS CO., LTD., Suwon-si (KR)

(72) Inventors: In-Su Kim, Yongin-si (KR); Hyun Jin Choi, Suwon-si (KR); Alain Tran, Hwaseong-si (KR); Beom Kyu Shin, Seongnam-si (KR); Woo Seong Cheong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 36 days.

(21) Appl. No.: 17/191,412

(22) Filed: Mar. 3, 2021

(65) Prior Publication Data

US 2022/0076755 A1 Mar. 10, 2022

(30) Foreign Application Priority Data

Sep. 10, 2020 (KR) .................. 10-2020-0116067

(51) Int. Cl.
  *G11C 16/10* (2006.01)
  *G11C 16/16* (2006.01)
  *G11C 16/26* (2006.01)
  *G11C 16/32* (2006.01)

(52) U.S. Cl.
  CPC ............ *G11C 16/107* (2013.01); *G11C 16/16* (2013.01); *G11C 16/26* (2013.01); *G11C 16/32* (2013.01)

(58) Field of Classification Search
  CPC ....... G11C 16/107; G11C 16/16; G11C 16/26; G11C 16/32
  See application file for complete search history.

(56) References Cited

U.S. PATENT DOCUMENTS

| 6,373,750 B1 | 4/2002 | Kurosaki |
| 8,364,888 B2 | 1/2013 | Melik-Martirosian et al. |
| 8,780,630 B2 | 7/2014 | Park |
| 9,208,076 B2 | 12/2015 | Kim et al. |

(Continued)

FOREIGN PATENT DOCUMENTS

| KR | 0907028 B1 | 7/2009 |
| KR | 1262788 B1 | 5/2013 |

OTHER PUBLICATIONS

European Search Report dated Jan. 21, 2022, Cited in EP Patent Application No. 21196171.9.

(Continued)

*Primary Examiner* — Connie C Yoha
(74) *Attorney, Agent, or Firm* — Volentine, Whitt & Francos, PLLC

(57) ABSTRACT

A memory controller includes an interface and a control module. The interface interfaces with a memory device which includes a plurality of dies that each include a plurality of blocks. The control module groups a plurality of blocks included in different dies and manages the plurality of blocks as a super block. The control module performs scheduling to alternately perform a program on a part of an Nth super block, wherein N is a natural number, and a phased erase on an N+1st super block, and the control module completes the program on the Nth super block and the erase on the Nth super block before the program on the N+1st super block starts.

20 Claims, 13 Drawing Sheets

(56) References Cited

U.S. PATENT DOCUMENTS

2015/0043277 A1* 2/2015 Fitzpatrick ............ G06F 3/0616
                                                        365/185.11
2019/0087128 A1   3/2019 Shin
2020/0042438 A1*  2/2020 Yi ....................... G06F 12/0246
2020/0043556 A1   2/2020 Moon et al.
2020/0082891 A1*  3/2020 Lee .................... G06F 12/0246

OTHER PUBLICATIONS

First Office Action dated Feb. 2, 2022, Cited in EP Patent Application No. 21196171.9.

* cited by examiner

MEMORY CONTROLLER, MEMORY DEVICE AND STORAGE DEVICE

CROSS-REFERENCE TO RELATED APPLICATION

This U.S. nonprovisional patent application claims the benefit of priority under 35 U.S.C. § 119 to Korean Patent Application No. 10-2020-0116067, filed on Sep. 10, 2020 in the Korean Intellectual Property Office, the contents of which are herein incorporated by reference in their entirety.

BACKGROUND

1. Technical Field

The inventive concept(s) described herein relate to a memory controller, a memory device, and a storage device.

2. Description of the Related Art

By configuring a storage device so that a plurality of NAND dies operate in parallel, consistency of write performance may be enhanced. For example, a plurality of blocks included in NAND dies different from each other may be grouped and controlled by super block management.

In order to program a specific block of a NAND die, an erase of the specific block needs to precede programming. While the NAND die performs the erase operation, the programming required for the NAND die may not be performed. If all the plurality of NAND dies controlled in this manner by the super block management have blocks being erased, none of the plurality of NAND dies may execute programming requested by a host. That is, a throughput (a host write throughput) may be 0 in a section in which all the plurality of NAND dies have blocks being erased.

SUMMARY

According to aspects of the present disclosure, a memory controller and a memory device are capable of improving erasing of a plurality of NAND dies controlled by a super block management and thereby enhancing the consistency of write performance. According to another aspect of the present disclosure, a storage device that includes the memory controller and the memory device is capable of improving erasing of the plurality of NAND dies controlled by the super block management and thereby enhancing the consistency of write performance.

However, aspects of the inventive concept(s) described herein are not restricted to those set forth herein. Other aspects of the inventive concept(s) described herein will become more apparent to one of ordinary skill in the art to which the present disclosure pertains by referencing the detailed description of the present disclosure as provided below.

According to an aspect of the present disclosure, a memory controller includes an interface and a control module. The interface is provided for communicating with a memory device which includes a first die and a second die. The first die includes a first block and a second block, and the second die includes a third block and a fourth block. The control module manages the memory device in units of a first super block and a second super block. The first super block includes the first block and the third block, and the second super block including the second block and the fourth block. The control module causes a program of the first super block and an erase of the second super block to complete before starting the program of the second super block. The erase of the second super block is performed in multiple steps. Completion of the program of the first super block and the erase of the second super block includes performing a first step erase of the second block after programming a first portion of the first block, programming a second portion of the first block after the first step erase of the second block, and performing a second step erase of the second block after programming the second portion of the first block.

According to another aspect of the present disclosure, a memory controller includes an interface and a control module. The interface interfaces with a memory device including a plurality of dies that each include a plurality of blocks. The control module groups the plurality of blocks included in different dies and manages the plurality of blocks as super blocks. The control module performs scheduling to alternately perform a program of a part of an Nth super block, wherein N is a natural number, and a phased erase of an N+1st super block. The control module causes the program on the Nth super block and the erase on the N+1st super block to complete before the program on the N+1st super block starts.

According to another aspect of the present disclosure, a memory device includes a first die and a second die. The first die includes a first block and a second block. The second die includes a third block and a fourth block. The memory device is controlled in units of a first super block and a second super block, the first super block includes the first block and the third block, and the second super block includes the second block and the fourth block. Before starting a program of the second super block, a program of the first super block and an erase of the second super block are completed, and the erase of the second super block is divided into multiple steps. Completion of the program of the first super block and the erase of the second super block includes performing a first step erase of the second block after programming a first portion of the first block, programming a second portion of the first block after the first step erase of the second block, and performing a second step erase of the second block after programming the second portion of the first block.

According to an aspect of the present disclosure, a storage device includes a memory device and a controller. The memory device includes a first die and a second die. The first die includes a first block and a second block, and the second die includes a third block and a fourth block. The controller manages the memory device by a first super block or a second super block. The first super block includes the first block and the third block, and the second super block includes the second block and the fourth block. The controller completes a program on the first super block and an erase on the second super block before starting the program of the second super block, and divides performance of the erase on the second super block into multiple steps. The program of the first super block and the erase of the second super block include performing a first step erase of a second block after programming a first portion of the first block, programming a second portion of the first block after the first step erase of the second block, and performing a second step erase of the second block after programming a second portion of the first block.

According to an aspect of the present disclosure, a memory controller includes an interface and a control module. The interface is provided for communicating with a memory device which includes a first die and a second die. The first die includes a first block and a second block, and the second die includes a third block and a fourth block. The control module manages the memory device in units of a first super block and a second super block. The first super block includes the first block and the third block, and the second super block includes the second block and the fourth block. The control module causes a program of the first super block and an erase of the second super block to complete, before starting the program of the second super block, and the control module controls so that an erase section of the second block of the first die and an erase section of the fourth block of the second die only partially overlap to erase the second super block.

According to another aspect of the present disclosure, a memory controller includes an interface and a control module. The interface is provided for communicating with a memory device which includes a first die and a second die. The first die includes a first block and a second block, and the second die includes a third block and a fourth block. The control module manages the memory device in units of a first super block and a second super block. The first super block includes the first block and the third block, and the second super block includes the second block and the fourth block. The control module completes an erase of the second super block before starting a program of the second super block. The erase of the second super block includes starting the erase of the second block of the first die, reducing a total token from an initial number by a predetermined consumed token, when the erase of the second block of the first die starts, increasing the number of total tokens with an erase progress time, and starting the erase of the fourth block of the second die, when the number of total tokens reaches the number of threshold tokens.

According to an aspect of the present disclosure, a memory device includes a first die and a second die. The first die includes a first block and a second block. The second die includes a third block and a fourth block. The memory device is controlled in units of a first super block and a second super block. The first super block includes the first block and the third block, and the second super block includes the second block and the fourth block. Before starting a program of the second super block, a program of the first super block and an erase of the second super block are completed, and the second super block is erased by controlling so that an erase section of the second block of the first die and an erase section of the fourth block of the second die only partially overlap.

According to an aspect of the present disclosure, a storage device includes a memory device and a controller. The memory device includes a first die and a second die. The first die includes a first block and a second block, and the second die includes a third block and a fourth block. The controller manages the memory device by a first super block or a second super block. The first super block includes the first block and the third block, and the second super block includes the second block and the fourth block. The controller completes a program on the first super block and an erase on the second super block, before starting the program of the second super block, and the controller controls so that an erase section of the second block of the first die and an erase section of the fourth block of the second die only partially overlap to erase the second super block.

Specific matters of other embodiments are included in the detailed description and drawings.

BRIEF DESCRIPTION OF THE DRAWINGS

These and other aspects and features of the inventive concept(s) described herein will become more apparent by describing in detail exemplary embodiments thereof referring to the attached drawings, in which.

DETAILED DESCRIPTION OF THE EMBODIMENTS

Figure 1:
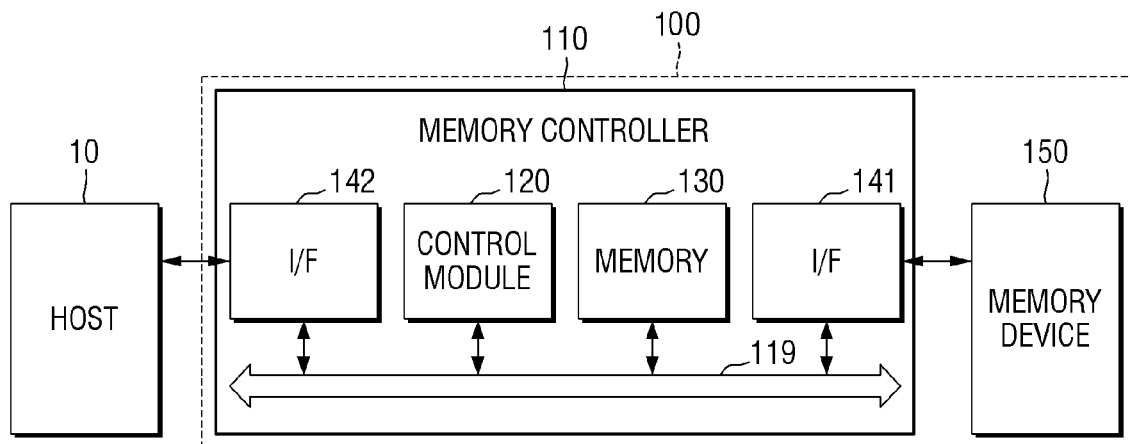
FIG. 1 is a block diagram illustrating a system including a storage device according to some embodiments of the present disclosure.

In the following detailed description, for the purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

The terminology used herein is for purposes of describing particular embodiments only and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Hereinafter, various embodiments of the present disclosure will be explained referring to the accompanying drawings.

Figure 2:
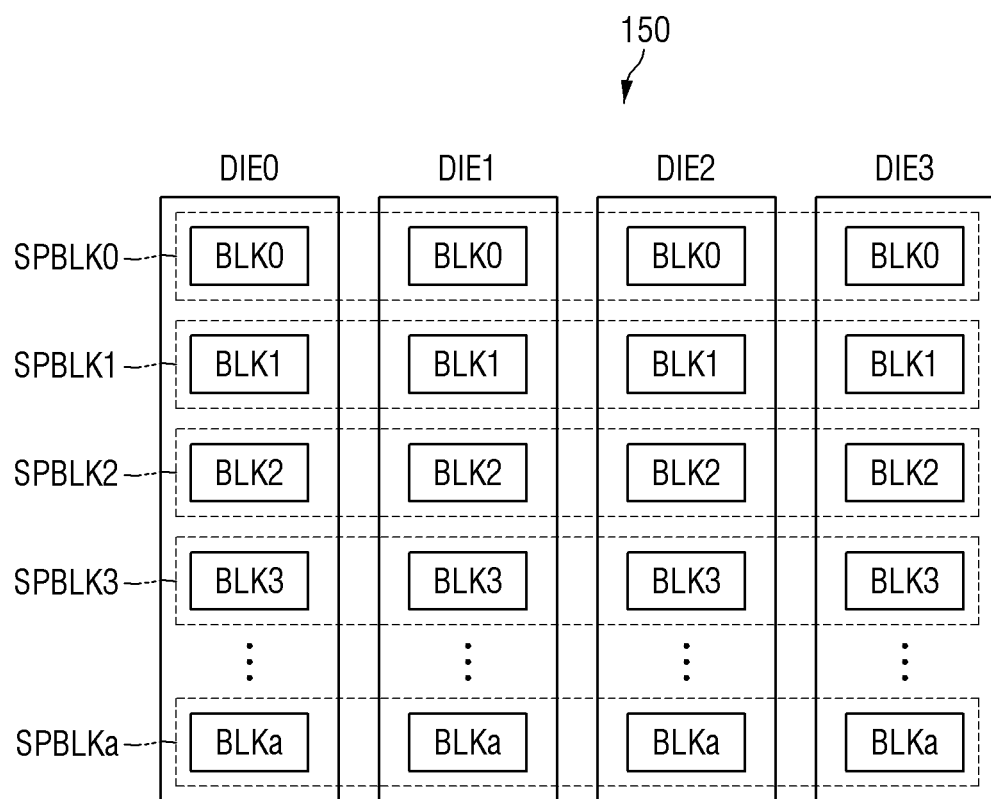
FIG. 2 is a block diagram illustrating a memory device of the system in FIG. 1.

FIG. 1 is a block diagram illustrating a system including a storage device according to some embodiments of the present disclosure. FIG. 2 is a block diagram illustrating a memory device of the system in FIG. 1.

The system of FIG. 1 may be a mobile system such as a mobile phone, a smart phone, a laptop computer, a tablet PC (tablet personal computer), a wearable device, a healthcare device or an IOT (internet of things) device. However, the system of FIG. 1 is not necessarily limited to mobile systems, but may also be a personal computer, a workstation computer, a server, a media player, or an automotive device such as a navigation controller.

Referring to FIG. 1, the storage device 100 may communicate with the host 10 to write or read data at the request of the host 10. The host 10 may be physically separated from the storage device 100 and may be connected to the storage device 100 via a wired interface or a wireless interface. Nevertheless, the host 10 and the storage device 100 may also or alternatively be components of an integrated system, and may even be housed within a common housing.

The storage device 100 functions as a non-volatile storage device that stores data regardless of a power supply. In FIG. 1, the storage device 100 includes a memory controller 110, and a memory device 150 that stores data under the control of the memory controller 110.

The memory controller 110 may include an arrangement of circuitry and/or other components including a memory interface 141, a host interface 142, a control module 120, and a memory 130 connected to each other through a bus 119. The control module 120 communicates with the host 10 through the host interface 142, and controls the memory device 150 through the memory interface 141. The control module 120 performs some or all aspects of methods attributed to the memory controller 110 herein, such as an erase control method to be explained referring to FIGS. 4 to 18. The control module 120 may be or include a processor, such as a microprocessor, that executes instructions from the memory 130 to implement some or all aspects of methods attributed to the control module 120 herein. The control module 120 may also or alternatively be or include an application specific integrated circuit (ASIC).

The host interface 142 provides a connection that may send and receive data to and from the host 10, and may be, for example, compliant with various interface standards, protocols and/or conventions such as ATA (Advanced Technology Attachment), SATA (Serial ATA), e-SATA (external SATA), SCSI (Small Computer Small Interface), SAS (Serial Attached SCSI), PCI (Peripheral Component Interconnection), PCIe (PCI express), NVMe (NVM express), IEEE 1394, USB (universal serial bus), SD (secure digital) card, MMC (multi-media card), eMMC (embedded multi-media card), UFS (Universal flash Storage), eUFS (embedded Universal flash Storage), or CF (compact flash). The memory interface 141 may be implemented to comply with standard conventions such as Toggle or ONFI. Examples of the host interface 142 and/or the memory interface 141 includes ports, adapters, sockets, connectors, drives and other types of physical interfaces compliant with one or more standards, protocols and/or conventions of the type noted above.

The memory 130 may serve as a buffer memory which temporarily stores the data provided when the host 10 requests the write. Also, the memory 130 may also serve as a queue in which commands and information for tasks related to the operations of the memory device 150 (e.g., program commands, read commands, and refresh commands) are sequentially stored. Also, the memory 130 may be, but is not limited to, a volatile memory such as a SRAM (static random-access memory) and/or a DRAM (dynamic random-access memory).

The memory device 150 may include, but is not limited to, a V-NAND flash memory of 2D (2-dimensional) or 3D (3-dimensional) structure. As noted above, the storage device 100 may be physically separated from the host 10 and also or alternatively may be implemented in the same package as the host 10.

Referring to FIG. 2, the memory device 150 may include a plurality of dies from DIE0 to DIE3, i.e., DIE0, DIE1, DIE2 and DIE3.

Each of the dies DIE0 to DIE3 may include a plurality of blocks BLK0 to BLKa (here, a is a natural number). Super blocks SPBLK0 to SPBLKa are each a different group of a plurality of blocks BLK0 to BLKa included in different of the dies DIE0 to DIE3. The plurality of blocks BLK0 to BLKa of any particular super block may be selected by the memory controller 110 simultaneously. For example, in many embodiments described herein, a first die may be DIE0 and may include at least a first block (e.g., a BLK0) and a second block (e.g., a BLK1), and a second die may be DIE1 and may include a third block (e.g., a BLK0) and a fourth block (e.g., a BLK1).

Although in FIG. 2 a plurality of blocks belonging to the super block SPBLK0 are shown as BLK0 of each die DIE0 to DIE3 as an example, the present disclosure is not limited thereto. For example, the plurality of blocks belonging to the super block SPBLK0 may be BLK0 in the die DIE0, may be BLK1 in another die DIE1, and may be BLK2 in still another die DIE2. That is, there may be various methods for binding a plurality of blocks of the different dies DIE0 to DIE3 with any of the super blocks SPBLK0 to SPBLKa, and the relative order of the BLK in each DIE of any super block may vary.

Figure 3:
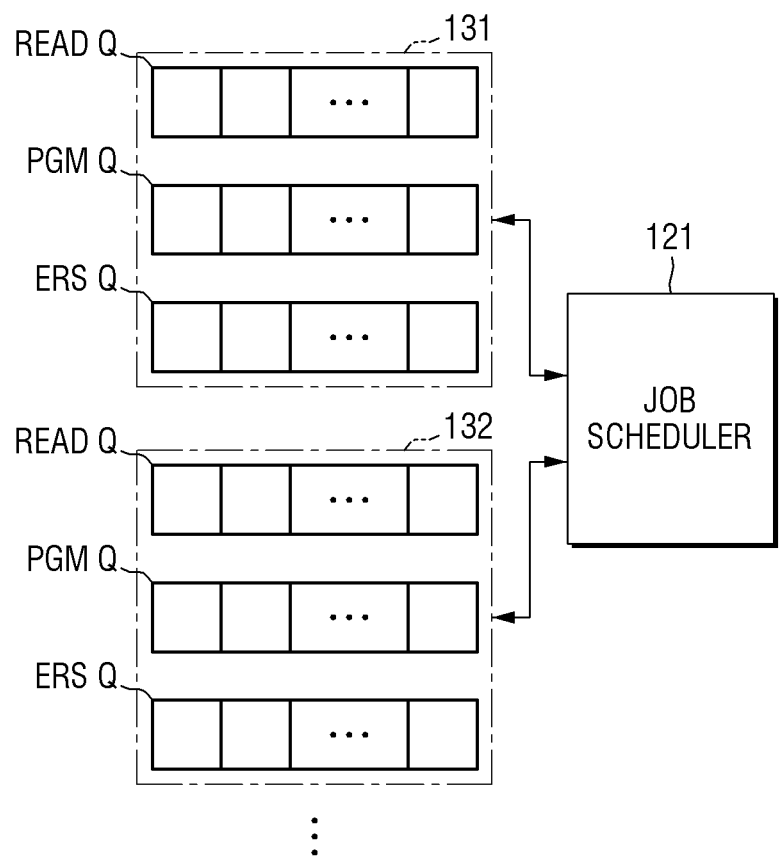
FIG. 3 is a diagram for explaining a queue and job scheduler used in a memory controller of the system in FIG. 1.

FIG. 3 is a diagram for explaining the queue and job scheduler used in a memory controller of the system in FIG. 1.

Referring to FIG. 3, the memory 130 of the memory controller 110 includes a plurality of queues 131 and 132. The control module 120 may include a job scheduler 121 that schedules tasks on the basis of commands stored in the queues 131 and 132 of the memory 130. For example, the job scheduler 121 may check a program command and an erase command and perform a scheduling operation. The queues 131 and 132 and other queues of the memory 130 may be physically and/or logically partitioned from one another and from other components of the memory 130. The queues 131 and 132 may also be dedicated to functionality as queues on a persistent basis so as to remain as queues 131 and 132 even when no tasks are stored therein or thereon.

Each of the plurality of queues 131 and 132 may correspond to a plurality of dies, respectively. For example, the queue 131 in FIG. 3 corresponds to the die DIE0 and sequentially stores commands related to the tasks to be performed in the die DIE0. Also, the queue 132 in FIG. 3 corresponds to the die DIE1, and sequentially stores commands related to the tasks to be performed by the die DIE1.

In particular, as shown in FIG. 3, program commands (PGMs) and erase commands (ERSs) may be managed separately inside each of different queues for a DIE. In FIG. 3, the plurality of program commands are stored sequentially in one queue (e.g., a second queue for each DIE as in FIG. 3) in the order of task. The plurality of erase commands are stored sequentially in another queue (e.g., a third queue for each DIE as in FIG. 3) in the order of task. Furthermore, the plurality of read commands may be stored sequentially in another queue (e.g., a first queue for each DIE in FIG. 3) in the order of task. The labels of first, second and third for the queues for each DIE in FIG. 3 are arbitrary, such that for each DIE (e.g., the DIE0, the DIE1, the DIE2 and the DIE3), a first queue may store a program command for a corresponding DIE for each of the plurality of DIEs, and a second queue which is different from the first queue may store an erase command for the corresponding DIE for each of the plurality of DIEs.

When managing the queue in this way, the control module 120 may check commands and perform a scheduling operation to schedule a plurality of pending tasks of different types. For example, using the plurality of queues in the manner arranged in FIG. 3, it is possible to perform the scheduling operation effectively, while simultaneously considering a program operation of the Nth super block (where N is a natural number) and an erase operation of the N+1st super block. The scheduling method will be explained below referring to FIGS. 4 to 18.

Figure 4:
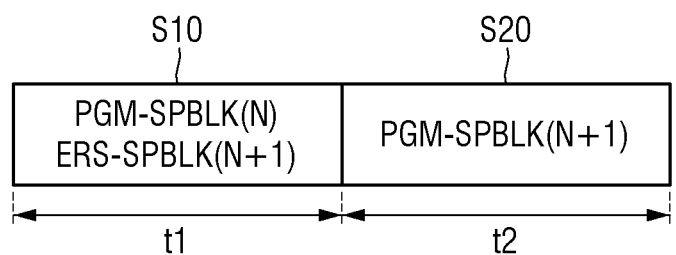
FIG. 4 is a conceptual diagram for explaining the operation of a memory controller according to some embodiments of the present disclosure.

FIG. 4 is a conceptual diagram for explaining the operation of the memory controller according to some embodiments of the present disclosure.

Referring to FIG. 4, it is assumed that the memory controller 110 controls performance of the program on the Nth super block (where N is a natural number) and performance of the program on the N+1st super block. That it, it is assumed that the control module 120 in the memory controller 110 controls performance of the program on the Nth super block (where N is a natural number) and performance of the program on the N+1st super block.

Here, the erase on the N+1st super block precedes the start of the program on the N+1st super block.

When the program on the Nth super block, the erase on the N+1st super block, and the program on the N+1st super block are performed in sequence, throughput (i.e., a host write throughput) may be 0 in at least a part of a section in which erase is performed on the N+1st super block. The reason is that, if all the dies corresponding to the N+1st super block have blocks that are being erased, all the dies corresponding to the N+1st super block may not perform the program requested by the host 10.

Specifically, the host write throughput may be kept above 0 while the program data provided by the host 10 is stored in a buffer memory such as the memory 130 in FIG. 1. However, from the moment when an amount of program data provided by the host 10 becomes larger than the storage capacity of the buffer memory (i.e., the memory 130), because the buffer memory may not receive any more program data provided by the host 10, the host write throughput becomes 0. A large amount of buffer memory is required in order to store all the program data provided by the host 10 during the time when all the dies with blocks included in the N+1st super block have blocks that are being erased. However, it is difficult to adopt a large capacity of buffer memory because its size is quite large.

In this way, when throughput becomes 0 in a section, the solution throughput of the storage device 100 has no choice but to deteriorate. This is because the solution throughput is calculated as an average of the throughput of a program section and the throughput of an erase section.

Even if a MAX throughput of the memory device 150 is larger than a Host Interface Max Write Throughput, when such a section in which the throughput becomes 0 occurs, the solution throughput becomes smaller than the Host Interface Max Write Throughput. Therefore, in order for the solution throughput to fulfill the Host Interface Max Write Throughput, it is necessary to improve the manner of erase on the N+1st super block.

As shown in FIG. 4, in some embodiments of the present disclosure, the program on the Nth super block and the erase on the N+1st super block are completed within a predetermined time t1 at S10, and thereafter, the program on the N+1st super block is performed within a time t2 at S20. The program on the N+1st super block may be held until the predetermined time t1 has passed, and/or until the program on the Nth super block and the erase on the N+1st super block are completed.

In FIG. 4, within the time (i.e., t1) at which the program on the Nth super block needs to be completed, the erase on the N+1st super block is not completed at once, and the erase on the N+1st super block may be divided into multiple steps. That is, the erase on the N+1st super block may be divided into multiple steps, and the erase section performed at one time may be adjusted to be shorter. When the erase on the N+1st super block is divided into multiple steps each with a lower duration, since the data provided by the host 10 may be stored in the buffer memory during the erase section without significantly increasing the storage capacity of the buffer memory, the host write throughput does not become 0. Such an erase method will be explained below referring to FIGS. 5 to 13.

Alternatively, the control may be performed so that the erase sections of the dies overlap to a minimum within the time (i.e., t1) at which the program on the Nth super block needs to be completed. With such a control, since it is possible to prevent a situation in which all dies perform the erase operations at the same time, the host write throughput does not become 0. Such an erasing method will be explained below referring to FIGS. 14 to 18.

A method of performing the erase of the super block divided into multiple steps will be explained referring to FIGS. 5 to 13.

Figure 5:
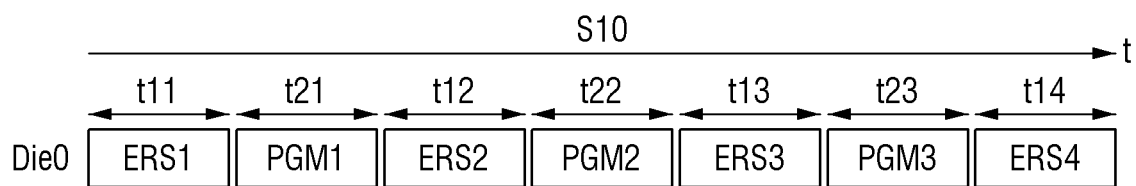
FIG. 5 and FIG. 6 are diagrams for explaining the operation of a memory controller according to some embodiments of the present disclosure.
Figure 6:
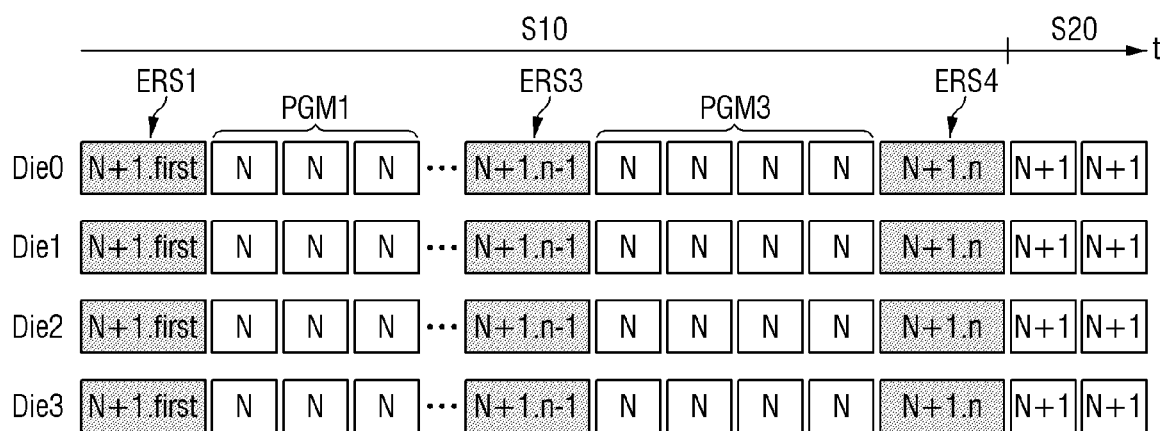

FIG. 5 and FIG. 6 are diagrams for explaining the operation of the memory controller according to some embodiments of the present disclosure.

First, referring to FIG. 5, programs PGM1 to PGM3 of a part of the Nth super block, and phased erases ERS1 to ERS4 of the N+1st super block are alternately performed for a predetermined time t1, so that the programs PGM1 to PGM3 on the Nth super block and the erases ERS1 to ERS4 on the Nth super block are completed before the N+1st super block program starts at S10.

FIG. 5 is explained using a first block (e.g., BLK0) of the first die (e.g., DIE0) included in the Nth super block and a second block (e.g., BLK1) of the first die DIE0 included in the N+1st super block.

A first step erase ERS1 of the second block BLK1 is performed for the time tn. The erase is performed in block units. The erase on the second block BLK1 is performed according to a predetermined rule (or according to a predetermined standard), and then is suspended. The first step erase ERS1 is an erase operation from after the start of the erase on the second block BLK1 until suspension.

Subsequently, the program PGM1 on the first portion of the first block BLK0 is performed for the time t21. Since the program is performed in word line units, NAND flash cells connected to some word lines included in the first block BLK0 are programmed for the time t21. The meaning of the "portion" of the first block BLK0 in this embodiment may be NAND flash cells connected to at least one word line belonging to the first block BLK0.

Subsequently, a second step erase ERS2 of the second block BLK1 is executed for the time t12. The erase that was suspended for the second block BLK1 is resumed, performed according to the predetermined rule (or according to the predetermined standard), and then is suspended again. The second step erase ERS2 is an erase operation from when the erase of the second block BLK1 is resumed and until the erase operation is suspended again.

Subsequently, a program PGM2 on the second portion of the first block BLK0 is performed for the time t22.

Subsequently, a third step erase ERS3 of the second block BLK1 is executed for time t13. Similarly, the third step erase ERS3 is an erase operation from when the erase on the suspended second block BLK1 is resumed and until the erase operation is suspended again.

Subsequently, the program PGM3 on the third portion of the first block BLK0 is performed for the time t23.

Subsequently, a fourth step erase ERS4 of the second block BLK1 is executed for the time t14, and thus, the erase on the second block BLK1 is completed. Similarly, the fourth step erase ERS4 is an erase operation from when the erase of the second block BLK1 is resumed and until the erase is completed.

For convenience of explanation, although FIG. 5 explains that the erase on the second block BLK1 is completed through the four-step erase, embodiments based on FIG. 5 are not limited thereto. Although, the program of the first block BLK0 is explained as being divided into three steps, embodiments based on FIG. 5 are not limited thereto.

Referring to FIG. 6, programs PGM1 to PGM3 on a plurality of dies (e.g., DIE0 to DIE3) with blocks included in the Nth super block, and the erases ERS1 to ERS4 on a plurality of dies (e.g., DIE0 to DIE3) with blocks included in the N+1st super block are performed alternately.

As shown, in the first step erase ERS1 section, the first step erase (see, reference numeral "N+1.first") of the first block BLK0 of each die (e.g., DIE0 to DIE3) with blocks included in the N+1st super block may be performed. Accordingly, four blocks total are subject to the step erase operation, and the erased blocks are one block (i.e., the first block BLK0) of each of the four DIEs with blocks included in the N+1st super block.

Subsequently, in the program PGM1 section, the program of the second block BLK1 of each die (e.g., DIE0 to DIE3) with blocks included in the Nth super block is performed. Unlike the programming shown in FIG. 5, here four blocks total are programmed, and the programmed blocks are one block (i.e., the second block BLK1) of each of the four DIEs with blocks included in the Nth super block.

Subsequently, in the third step erase ERS3 section, a n−1 step erase (see, reference numeral "N+1.n−1") of the first block BLK0 of each die (e.g., DIE0 to DIE3) with blocks included in the N+1st super block may be performed. Here, again, four blocks total are subject to the step erase operation, and the erased blocks are one block (i.e., the first block BLK0 again) of each of the four DIEs with blocks included in the N+1st super block.

Subsequently, in the program PGM3 section, the program of the second block BLK1 of each die (e.g., DIE0 to DIE3) with blocks included in the Nth super block is performed. Here, again, the four blocks total are programmed, and the programmed blocks are one block (i.e., the second block BLK1 again) of each of the four DIEs with blocks included in the Nth super block.

Subsequently, in a fourth step erase ERS4 section, a n-step erase (see, reference numeral "N+1.n") of the first block BLK0 of each die (e.g., DIE0 to DIE3) with blocks included in the N+1st super block may be performed. Here, again, four blocks total are subject to the step erase operation, and the erased blocks are one block (i.e., the first block BLK0 again) of each of the four DIEs with blocks included in the N+1st super block.

As shown, the multiple step erase (ERS1 to ERS4) sections of each die (e.g., DIE0 to DIE3) with blocks included in the N+1st super block may overlap each other. However, since the step erase (ERS1 to ERS4) sections of each step are short compared to performing the erase operation for the first block BLK0 of each die (e.g., DIE 0 to DIE3) without stopping until completion, the data provided by the host 10 may be stored in the buffer memory during the erase (ERS1 to ERS4) sections of each step without significantly increasing the storage capacity of the buffer memory (e.g. the memory 130), and the host write throughput does not become 0.

Hereinafter, an implementing method of alternately performing a program on a part of the Nth super block and a phased erase of the N+1st super block will be explained referring to FIGS. 7 to 10 as an example. For convenience of explanation, FIGS. 7 to 10 mainly explain the operation of the first die DIE0.

Figure 7:
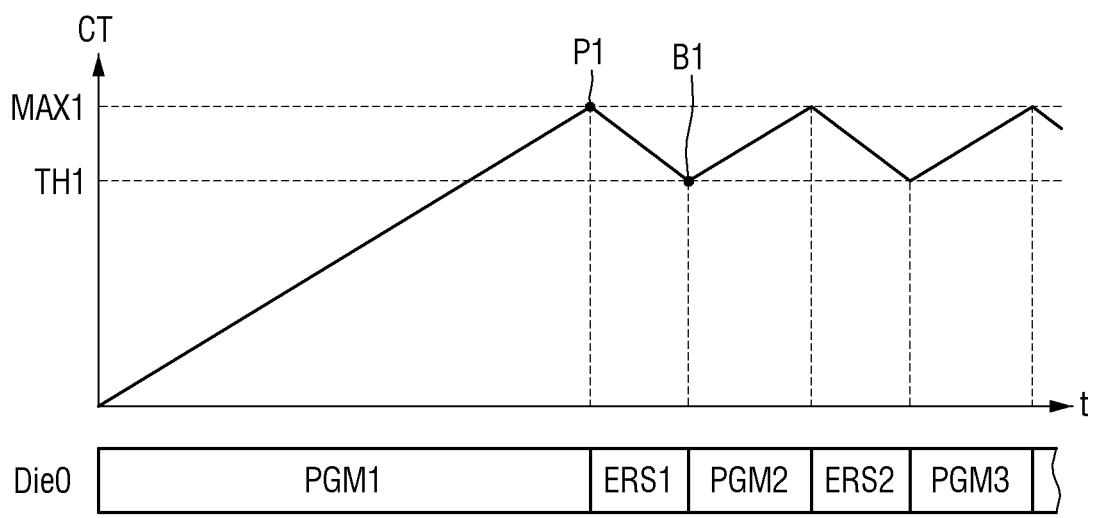
FIG. 7, FIG. 8, FIG. 9, and FIG. 10 are diagrams for explaining an implementing method in which a program on a part of a Nth super block and a phased erase of a N+1st super block are alternately performed.
Figure 8:
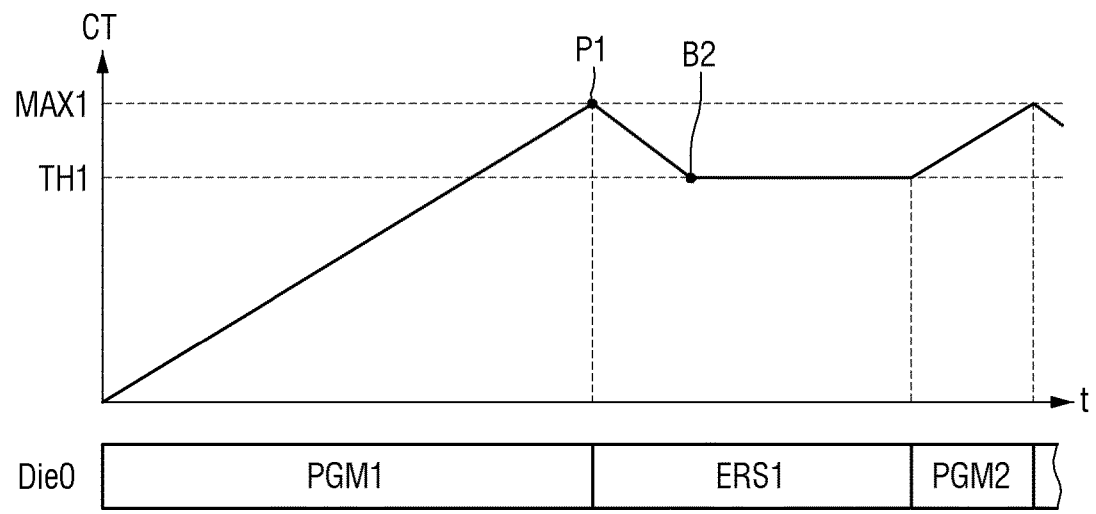
Figure 9:
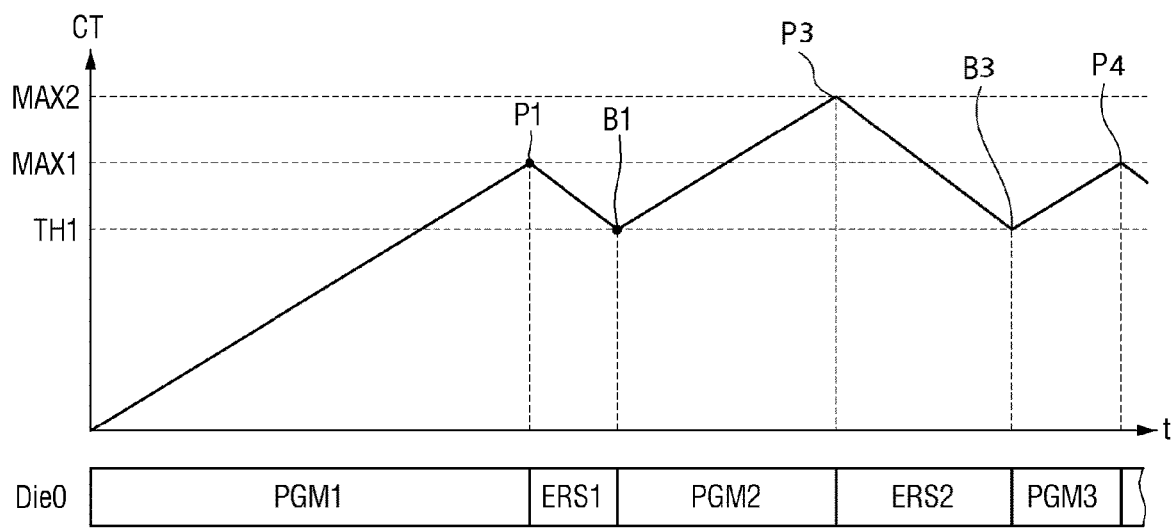

FIG. 7, FIG. 8 and FIG. 9 are diagrams indicating a current throughput (Current_throughput). In each of FIG. 7, FIG. 8 and FIG. 9, an x-axis indicates a time, and a y-axis indicates a throughput. TH1 indicates a threshold throughput, and MAX1 indicates the maximum throughput of the first die.

As shown in FIG. 7, FIG. 8, and FIG. 9, and as explained below, when a program of a block (e.g., BLK0) is performed, the current throughput of the DIE (e.g., DIE0) that includes the block increases, whereas when an erase of the block (e.g., BLK1) is performed, the current throughput of the DIE (e.g., DIE0) that includes the block decreases. Thus, for a first DIE, the current throughput of the first DIE increases when the program of the first block of the first DIE is performed, and the current throughput of the first DIE decreases when the erase of the second block of the first DIE is performed. First, referring to FIG. 7, a first program PGM1 on the first block BLK0 of the first die DIE0 is performed. While the first program PGM1 is performed, the current throughput continuously increases and may reach the maximum throughput MAX1 (see, reference numeral P1).

When the first program PGM1 is completed, the first step erase ERS1 of the second block BLK1 may be performed. If the current throughput of the first die DIE0 is greater than the threshold throughput TH1 when the first program PGM1 is completed, the first step erase ERS1 of the second block BLK1 may be performed. Here, since the program operation is not performed during an erase operation, the current throughput is reduced from the maximum throughput MAX1 to the threshold throughput TH1 (see, reference numeral B1). When the current throughput becomes equal to or smaller than the threshold throughput TH1, it is confirmed whether a program task waits in the queue. If the program task awaits, the erase operation is suspended.

Subsequently, the waiting program tsk (i.e., the second program PGM2) is performed. While the second program PGM2 is performed, the current throughput continuously increases and may reach the maximum throughput MAX1.

When the second program PGM2 is completed, the erase may be resumed to perform the second step erase ERS2 of the second block BLK1. If the current throughput of the first die DIE0 is greater than the threshold throughput TH1 when the second program PGM2 is completed, the second step erase ERS2 of the second block BLK1 may be performed. The current throughput is reduced from the maximum throughput MAX1 to the threshold throughput TH1. If the current throughput becomes equal to or smaller than the threshold throughput TH1 and the program task awaits, the erase operation is again suspended.

Then, the waiting program task (i.e., the third program PGM3) is performed. That is, the programming task that is waiting to be performed, is performed.

In this way, the program on the first block BLK0 and the erase on the second block BLK1 may be alternately performed so that the current throughput is controlled between the threshold throughput TH1 and the maximum throughput MAX1.

Referring to FIG. 8, the first program PGM1 on the first block BLK0 of the first die DIE0 is performed. While the first program PGM1 is performed, the current throughput continuously increases and may reach the maximum throughput MAX1 (see, reference numeral P1).

When the first program PGM1 is completed, the first step erase ERS1 of the second block BLK1 is performed. Since the program operation is not performed during an erase operation, the current throughput may be reduced from the maximum throughput MAX1 to the threshold throughput TH1 (see, reference numeral B2). When the current throughput reaches the threshold throughput TH1, it is confirmed whether the program task waits in the queue. If there is no waiting program task, the first step erase ERS1 is continued. Since there is no program requested by the host 10, even if the first step erase ERS1 is continued, the current throughput maintains the threshold throughput TH1.

When there is a program request from the host 10, the erase ERS1 is suspended, and the second program PGM2 on the first block BLK0 of the first die DIE0 is performed.

Figure 10:
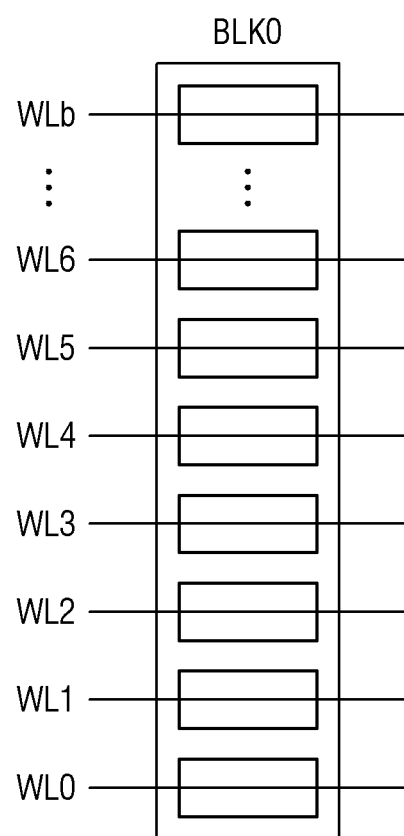

Referring to FIG. 9 and FIG. 10, the maximum throughput MAX1 and MAX2 may be set differently depending on the position where programming is occurring in the first block BLK0.

For example, in FIG. 10, when programming some word lines (for example, WL0 to WL2) at the beginning of the first block BLK0, the maximum throughput may be set to MAX1, and when programming some word lines (e.g., WL3 to WL6) located in the middle of the first block BLK0, the maximum throughput may be set to MAX2 greater than MAX1. Also, the maximum throughput when programming some word lines (e.g., WLb) located at the end of the first block may be reduced from MAX1 to MAX2.

The program of the first block BLK0 may be performed in the order of the arranged word lines (that is, in the order of WL0 to WLb).

The first program PGM1 on the first block BLK0 of the first die DIE0 is performed. Here, the first program PGM1 may be performed on the word lines WL0 to WL2. While the first program PGM1 is being performed, the current throughput continuously increases, and may reach the maximum throughput MAX1 (see, reference numeral P1).

When the first program PGM1 is completed, the first step erase ERS1 of the second block BLK1 is performed. The current throughput is reduced from the maximum throughput MAX1 to the threshold throughput TH1 (see, reference numeral B1). Because the program task waits in the queue, the erase is suspended.

Next, the waiting program task (i.e., the second program PGM2) is performed. Here, the second program PGM2 may be performed on the word lines WL3 to WL6. While the second program PGM2 is being performed, the current throughput continuously increases and may reach the maximum throughput MAX2 (see, reference numeral P3).

When the second program PGM2 is completed, the erase is resumed and the second step erase ERS2 of the second block BLK1 is performed. The current throughput is reduced from the maximum throughput MAX2 to the threshold throughput TH1 (see, reference numeral B3). When the program task waits, the erase is suspended.

A duration of the second step erase ERS2 is longer than a duration of the first step erase ERS1. Since the maximum throughput MAX2 is larger than the maximum throughput MAX1, the time taken to reach from the maximum throughput MAX2 to the threshold throughput TH1 (that is, the duration of the second step erase ERS2) becomes longer than the time taken to reach from the maximum throughput MAX1 to the threshold throughput TH1 (that is, the duration of the first step erase ERS1).

Next, the waiting program task (that is, the third program PGM3) is performed. The third program PGM3 may be performed on the word line WLb. While the third program PGM3 is being performed, the current throughput gradually increases and may reach the maximum throughput MAX1

(see, reference numeral P4). Although not shown separately, the third step erase ERS3 is performed after the third program PGM3, and the third step erase ERS3 is performed until the current throughput reaches from the maximum throughput MAX1 to the threshold throughput TH1. Therefore, the duration of the third step erase ERS3 is shorter than the duration of the second step erase ERS2.

In this way, the durations of the phased erases ERS1 and ERS2 may be adjusted by setting the maximum throughputs MAX1 and MAX2 differently depending on the position of the programming operation in the first block BLK0.

Figure 11:
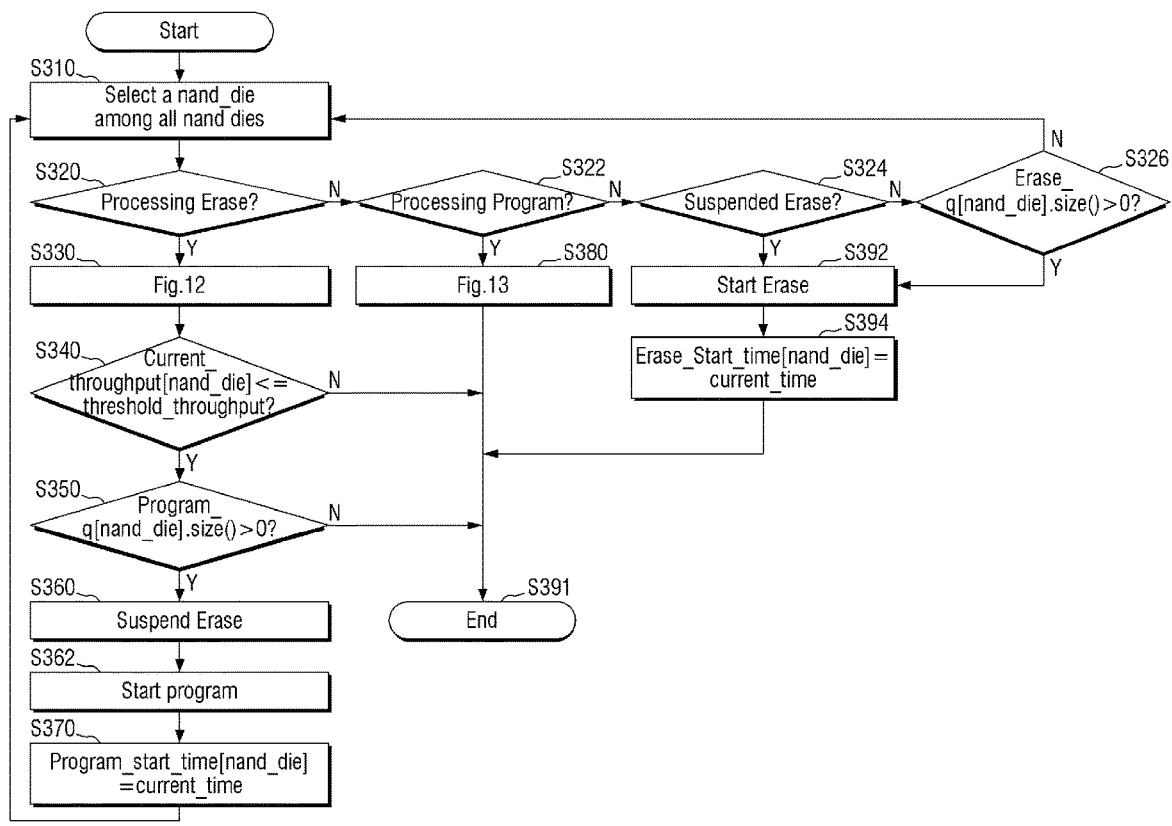
FIG. 11 is a flowchart for explaining the operation of a memory controller according to some embodiments of the present disclosure.
Figure 12:
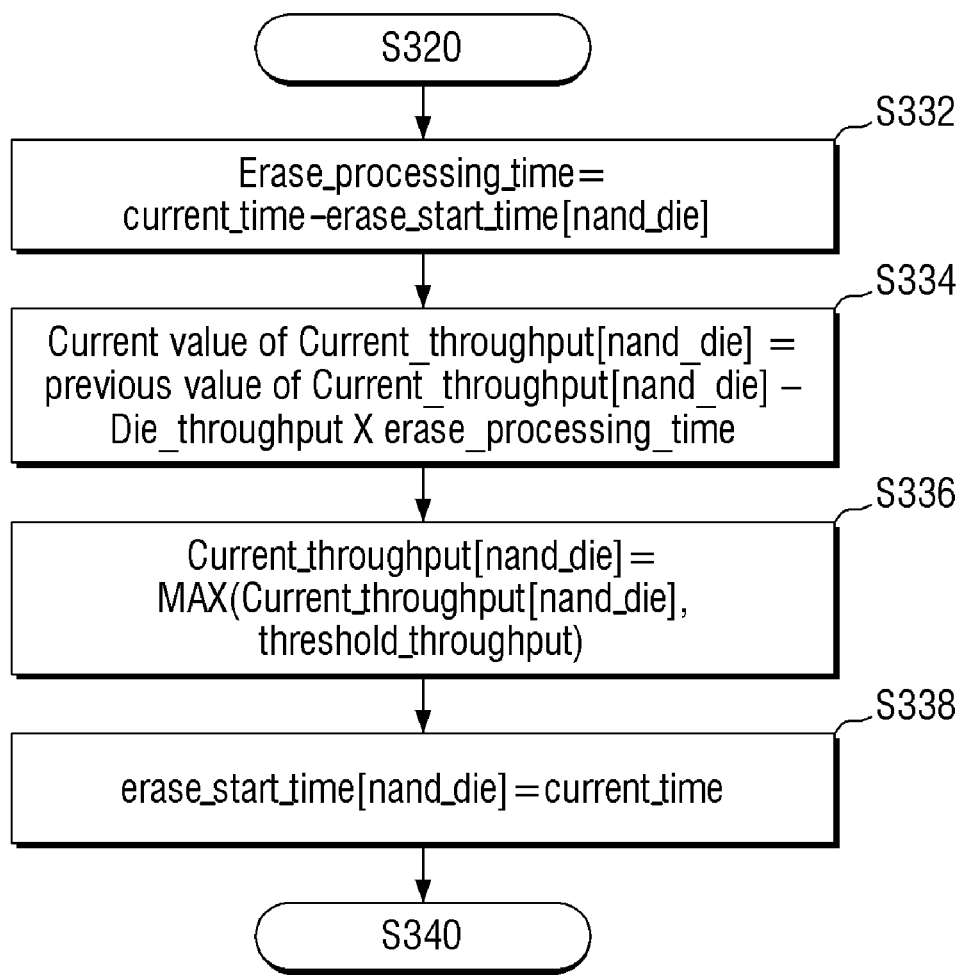
FIG. 12 is another flowchart for explaining the operation of a memory controller according to some embodiments of the present disclosure
Figure 13:
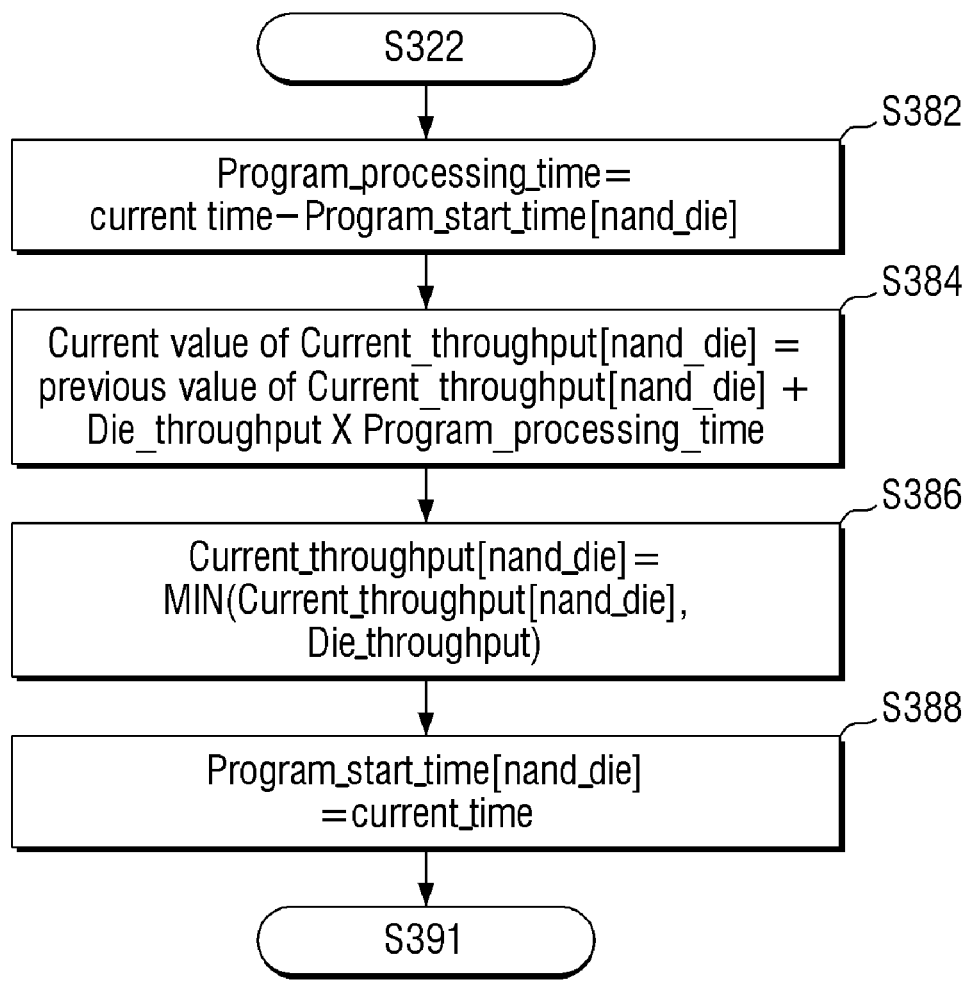
FIG. 13 is another flowchart for explaining the operation of a memory controller according to some embodiments of the present disclosure

FIG. 11, FIG. 12 and FIG. 13 are flowcharts for explaining the operation of the memory controller according to some embodiments of the present disclosure.

First, referring to FIG. 11, it is assumed that the program on the Nth super block and the erase on the N+1st super block are both waiting in the queue.

The process of FIG. 11 begins by selecting one die among all dies at S310. For example, the selected die may be selected according to a round robin procedure. Selection by the round robin procedure may mean selection of one die among all dies without prioritization.

All dies may be subject to selection by the round robin procedure, and dies may be individually selected using the round robin procedure in a plurality of selections.

Next, the process of FIG. 11 includes confirming whether the selected die is being erased at S320.

When the die is being erased (S320=Y), an erase start time (erase start_time) is subtracted from the current time (current_time) to calculate an erase processing time (erase_processing_time). The erase processing time is calculated at S332 as shown in FIG. 12.

Next, the current value of the current throughput (Current_throughput) is calculated at S334 as shown in FIG. 12. A value obtained by multiplying the throughput of the selected die (Die_throughput) by the erase processing time (erase_processing_time) is subtracted from the previous value of the current throughput to determine the current value of the current throughput.

Subsequently, at S336 in FIG. 12, the final current throughput (Current_throughput) is determined by comparing the value calculated in S334 with the threshold throughput (threshold_throughput). The final current throughput (Current_throughput) does not fall below the threshold throughput (threshold_throughput). As explained in FIG. 8, when there is no waiting program task, even if the erase operation is continued without suspension, the current throughput maintains the threshold throughput TH1.

Next, at S338 in FIG. 12, the erase start time (erase start_time) is recorded as the current time (current_time).

Referring to FIG. 11 again, after S338 in FIG. 12, at S340 it is checked whether the current throughput (Current_throughput) is equal to or smaller than the threshold throughput (threshold_throughput).

If the current throughput (Current_throughput) is equal to or smaller than the threshold throughput (threshold_throughput) (S340=Y), it is checked whether there is a waiting program at S350.

If there is a waiting program (S350=Y), the erase is suspended at S360, and the programming operation starts at S362. Next, the program start time (program start_time) is recorded as the current time at S370.

If there is no waiting program in step S350 (S350=N), the process ends at S391 and may return to the beginning. Or, if the current throughput (Current_throughput) is larger than the threshold throughput (threshold_throughput) in step S340 (S340=N), the process ends at S391 and may return to the beginning.

On the other hand, if the erase operation is not being performed in step S320 (S320=N), it is checked whether the program operation is performed at S322.

If the program operation is performed (S322=Y), the program start time (program start_time) is subtracted from the current time (current_time) to calculate the program processing time (program_processing_time), as shown in S382 of FIG. 13.

Next, the current value of the current throughput (Current_throughput) is calculated at S384 of FIG. 13. The previous value of current throughput is added to the value obtained by multiplying the throughput of die (Die_throughput) by the program processing time (program_processing_time) to determine the current value of current throughput.

Subsequently, the final current throughput (Current_throughput) is determined by comparing the value calculated at S384 with the throughput of die (Die_throughput), as shown in S386 of FIG. 13. The final current throughput (Current_throughput) does not exceed the throughput of die (Die_throughput) (i.e., the maximum throughput of die). This is because the current throughput may not exceed the throughput of die, even if only a program is continued without erasing in the middle.

Next, the program start time (program start_time) is recorded as the current time (current_time) at S388 of FIG. 13.

Referring to FIG. 11 again, after S338 in FIG. 13, the process ends at S391 and may return to the beginning.

On the other hand, if the program operation is not performed (S322=N) in step S322, it is checked whether there is a suspended erase (S324).

If there is a suspended erase (S324=Y), the erase is resumed again at S392.

Next, the erase start time (erase start_time) is recorded as the current time (current_time) at S394.

On the other hand, if there is no suspended erase (S324=N) in step S324, it is confirmed whether there is an erase task in the queue corresponding to the selected die at S326.

If there is an erase task in the queue (S326=Y), the erase starts at S392, and if there is no erase task in the queue (S326=N), the process returns to the beginning at S310.

Hereinafter, a method for controlling so that erase sections of the dies overlap to a minimum within the time (i.e., t1) at which the program on the Nth super block needs to be completed will be explained referring to FIGS. 14 to 19.

Figure 14:
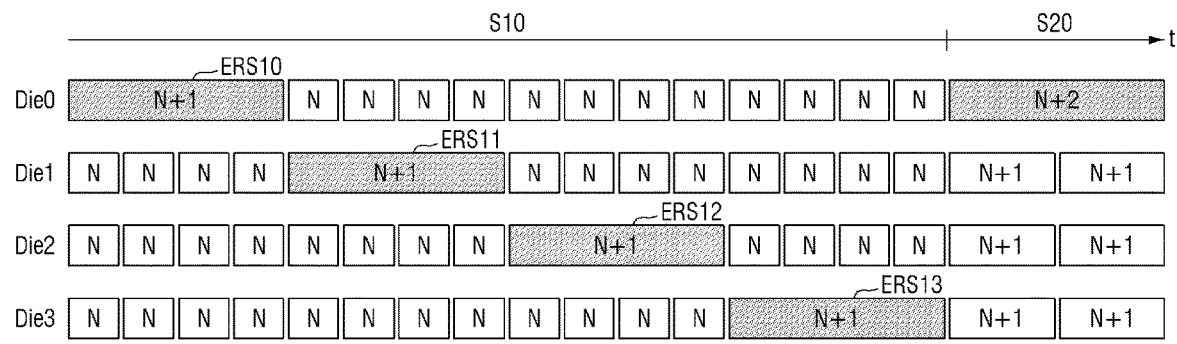
FIG. 14 is a diagram for explaining the operation of a memory controller according to some other embodiments of the present disclosure.

FIG. 14 is a diagram for explaining the operation of the memory controller according to some other embodiments of the present disclosure.

In FIG. 14, as with many other embodiments herein, a first die may be DIE0 and may include at least a first block (e.g., a BLK0) and a second block (e.g., a BLK1), and a second die may be DIE1 and may include a third block (e.g., a BLK0) and a fourth block (e.g., a BLK1). Referring to FIG. 14, the erase sections ERS10, ERS11, ERS12, and ERS13 of dies DIE0, DIE1, DIE2, and DIE3 are placed so as not to overlap each other for a predetermined time t1. For example, while a die DIE0 performs the erase ERS10 of the N+1st super block, other dies DIE1, DIE2, and DIE3 do not perform erases ERS11, ERS12, and ERS13 of the N+1st super block. Thus, for example, a first erase section of the second block of DIE0 and a first step erase section of the fourth block of DIE1 do not overlap at all in FIG. 14. Similarly, if a third die may be DIE2 and may include at least a fifth block (e.g., a BLK0) and a sixth block (e.g., a BLK1), the first erase section of the fourth block of DIE1 and a first erase section of the sixth block of DIE2 do not overlap at all in FIG. 14. Moreover, if a fourth die may be DIE3 and may include at least a seventh block (e.g., a BLK0) and an eighth block (e.g., a BLK1), the first erase section of the sixth block of DIE2 and the first erase section of the eighth block of DIE3 do not overlap at all in FIG. 14.

Specifically, if the program of the Nth super block needs to be completed for 100 ms, the erase of the N+1st super block also needs to be completed within 100 ms. For example, if the memory device is assumed to include four dies and the time taken for one die to perform the erase operation is 25 ms, the four dies may perform the erase without overlapping at all because the 4 segments each of 25 ms total to 100 ms.

However, if the time taken for one die to perform the erase operation is 30 ms, the four dies may not perform an erase without overlapping at all because the 4 segments each of 30 ms total to 120 ms, and thus exceed the 100 ms time for completion. When comparing the program time (100 ms) with the total erase time (120 ms), the erases of the four dies overlap by at least 20% (=20 ms/100 ms).

In this way, the overlapping erase sections may be determined in consideration of the program time of the Nth super block, and the erase time of each die (that is, the time to erase the blocks included in the N+1st super block on each die).

Figure 15:
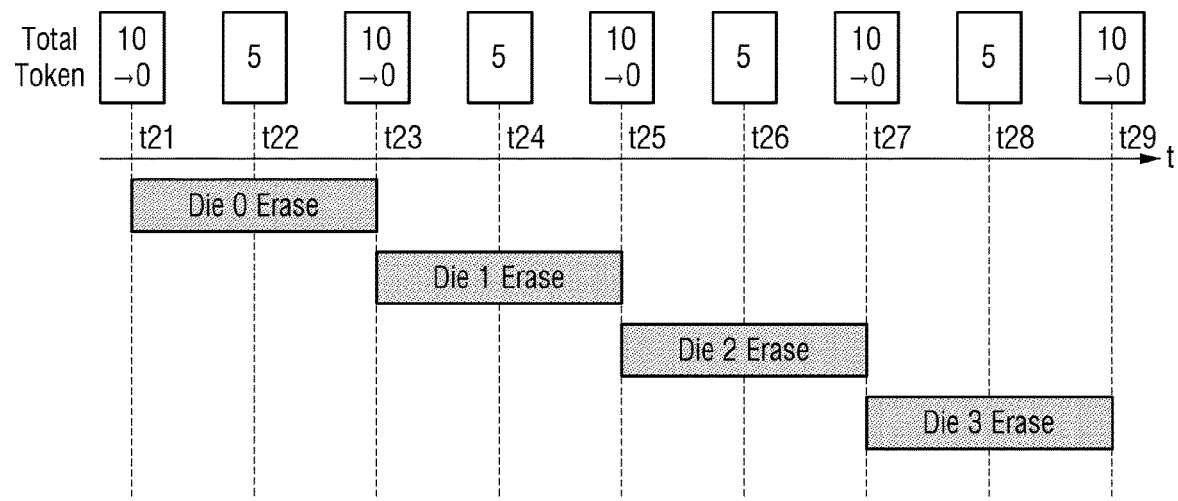
FIG. 15 and FIG. 16 are diagrams for explaining a control so that erase sections of the dies overlap to a minimum by introduction of a token concept.
Figure 16:
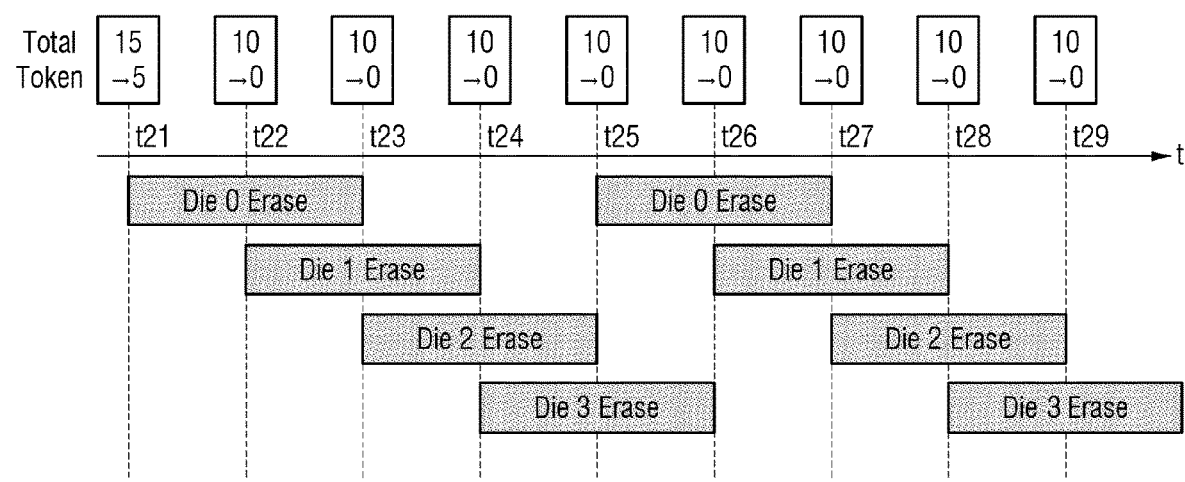

FIG. 15 and FIG. 16 show a control so that the erase sections of the dies overlap to a minimum by the introduction of a token concept.

The token concept described herein may be considered analogous to a timer such as an hourglass used to count up from an initial number of total tokens during a step erase and that is at 0 or from an offset from 0 at the beginning of each step erase. The initial number of total tokens and the rate of increase may both be adjusted based on a length of an erase section (e.g., durations of step erases for a second block and for a fourth block of a second super block), and/or based on a length of a program time (e.g., a duration of a programming operation for a first block and for a third block of a first super block).

Referring to FIG. 15, for example, the initial number of total tokens may be given as 10. The initial number of total tokens may be determined in consideration of the program time on the Nth super block, and the erase time of each die (that is, the time to erase the blocks included in the N+1st super block on each die).

At time t21, the blocks included in the N+1st super block of the first die DIE0 are erased. When the DIE0 erase starts, the initial number is reduced by predetermined consumed tokens. Because the initial number is 10, and the number of predetermined consumed tokens is 10, the total tokens becomes 0 at time t21 ($\therefore 10-10=0$).

If the erase progresses, the number of total tokens gradually increases with the erase progress time.

Or, the number of total tokens may increase in consideration of not only the erase progress time but also the number of dies in which the erase operation is being performed. That is, "erase progress time x number of erase operation dies=number of increased tokens" may be established. For example, if one die performs an erase for a specific time, the number of total tokens may be increased by 1 ($\therefore 1 \times 1=1$). However, if two dies perform the erase for the specific time, the number of total tokens may be increased by 2 ($\therefore 1 \times 2=2$). Hereinafter, a case where the number of total tokens is increased in consideration of the erase progress time and the number of dies in which the erase operation is being performed will be explained.

At time t22, the number of total tokens becomes 5 ($\therefore 5 \times 1=5$) in consideration of the erase progress time and the number of dies in which the erase operation is performed. Since the number of total tokens has not reached the number of threshold tokens (for example, 10), the blocks included in the N+1st super block of the second die DIE1 are not erased.

At time t23, the number of total tokens becomes 10 in consideration of the erase progress time and the number of dies in which the erase operation is performed. Since the number of total tokens has reached the number of threshold tokens (for example, 10), the blocks included in the N+1st super block of the second die DIE1 are erased. When the DIE1 erase starts, the total tokens decrease by predetermined consumed tokens, and becomes 0 ($\therefore 10-10=0$).

At time t24, the number of total tokens becomes 5.

At time t25, the number of total tokens becomes 10. Since the number of total tokens has reached the number of threshold tokens (for example, 10), the blocks included in the N+1st super block of the third die DIE2 are erased. When the DIE2 erase starts, the total tokens decrease by the predetermined consumed tokens, and becomes 0 (10-10=0).

At time t26, the number of total tokens becomes 5.

At time t27, since the number of total tokens becomes 10, the blocks included in the N+1st super block of the fourth die DIE3 are erased.

At time t28, the number of total tokens becomes 5.

At time t29, since the number of total tokens reached 10, although not shown separately, the erase of the blocks included in the N+1st super block is finished and the blocks included in the N+2nd super block of the first die DIE0 may be erased.

The greatest difference between the method explained in FIG. 16 and the method explained in FIG. 15 is that the initial number of total tokens is different. Referring to FIG. 16, for example, the initial number of total tokens may be given as 15. The initial number of total tokens is determined by considering the program time on the Nth super block, and the erase time of each die (that is, the time to erase the blocks included in the N+1st super block on each die). In FIG. 16, as with many other embodiments herein, a first die may be DIE0 and may include at least a first block (e.g., a BLK0) and a second block (e.g., a BLK1), and a second die may be DIE1 and may include a third block (e.g., a BLK0) and a fourth block (e.g., a BLK1). As explained below, in FIG. 16, for example, a first erase section of the second block of DIE0 and a first step erase section of the fourth block of DIE1 only partially overlap. Similarly, if a third die may be DIE2 and may include at least a fifth block (e.g., a BLK0) and a sixth block (e.g., a BLK1), the first erase section of the fourth block of DIE1 and a first erase section of the sixth block of DIE2 only partially overlap in FIG. 16. Moreover, if a fourth die may be DIE3 and may include at least a seventh block (e.g., a BLK0) and an eighth block (e.g., a BLK1), the first erase section of the sixth block of DIE2 and the first erase section of the eighth block of DIE3 only partially overlap in FIG. 16.

Referring to FIG. 16, at time t21, the blocks included in the N+1st super block of the first die DIE0 are erased. When the DIE0 erase starts, the total tokens are reduced from the initial number 15 by predetermined consumed tokens 10, and becomes 0 at time t21 ($\therefore 15-10=5$).

The number of total tokens increases, in consideration of the erase progress time and the number of dies in which the erase operation is performed.

At time t22, the total tokens increase by 5 (∴ 5×1=5), in consideration of the erase progress time and the number of dies in which the erase operation is performed, and the number of total tokens becomes 10. Since the number of total tokens has reached the number of threshold tokens (for example, 10), the blocks included in the N+1st super block of the second die DIE1 are erased. Since the erase starts, the total tokens decrease by the predetermined consumed tokens 10, and becomes 0 (∴ 10−10=0). At time t22, under the situation in which the erase of the first die DIE0 does not end, it may be known that the erase of the second die DIE1 starts.

At time t23, the total tokens increase by 10 (∴ 5×2=10) in consideration of the erase progress time and the number of dies in which the erase operation is performed, and the number of total tokens becomes 10. Since the number of total tokens has reached the number of threshold tokens (for example, 10), the blocks included in the N+1st super block of the third die DIE2 are erased. Since the erase starts, the total tokens decrease by predetermined consumed token 10, and becomes 0 (∴ 10−10=0). At time t23, under the situation in which the erase of the second die DIE1 is not ended, it may be known that the erase of the third die DIE2 starts.

At time t24, the total tokens increase by 10 (∴ 5×2=10), in consideration of the erase progress time and the number of dies in which the erase operation is performed, and the number of total tokens becomes 10. The blocks included in the N+1st super block of the fourth die DIE3 are erased. The erase starts, and at the same time, the total tokens decrease by predetermined consumed tokens 10, and becomes 0 (∴ 10−10=0).

Similarly, at time t25, the total token becomes 10, and the blocks included in the N+2nd super block of the first die DIE0 are erased.

At time t26, the total token becomes 10, and the blocks included in the N+2nd super block of the second die DIE1 are erased.

At time t27, the total token becomes 10, and the blocks included in the N+2nd super block of the third die DIE2 are erased.

At time t28, the total token becomes 10, and the blocks included in the N+2nd super block of the fourth die DIE3 are erased.

As explained using FIGS. 15 and 16, by setting the number of tokens to increase in consideration of at least one of the initial number of total tokens, the number of tokens consumed at the start of the erase, and the erase progress time, it is possible to control the degree of overlap of the erase sections of the plurality of dies. For example, as explained below, when a first die includes a first block and a second block and a second die includes a third block and a fourth block, the relative and/or absolute amount of overlap of the overlapping section changes or may be changed. The change in relative and/or absolute amount of overlap may be based on, for example, a program time of the first super block, a length of the erase section of the second block of the first die, and a length of the erase section of the fourth block of the second die (e.g., when the second block of the first die and the fourth block of the second die comprise a second super block). The number of total tokens at the start of a step erase may change or be changed based on factors such as these.

For example, as shown in FIG. 15, by setting the initial number of total tokens to 10 and the number of tokens consumed at the start of erase to 10, it is possible to perform the control so that the erase sections of two dies (e.g., DIE0 and DIE1) do not overlap. The control may be performed so that the erase of the first die DIE0 ends, and at the same time, the erase of the second die DIE1 starts.

As shown in FIG. 16, by setting the initial number of total tokens to 15 and the number of tokens consumed at the start of erase to 10, it is possible to perform the control so that the erase sections of the two dies (e.g., DIE0 and DIE1) overlap each other by about 50%.

As still another example, when the initial number of total tokens is set to 12, and the number of tokens consumed at the start of erase is set to 10, it is possible to perform he control so that the erase sections of the two dies (e.g., DIE0 and DIE1) overlap each other by about 20%.

As still another example, when the initial number of total tokens is set to 8, and the number of tokens consumed at the start of erase is set to 10, it is possible to perform the control so that an erase free section (a section in which the erase is not performed on any die) is located between the erase sections of two dies (e.g., DIE0 and DIE1).

Figure 17:
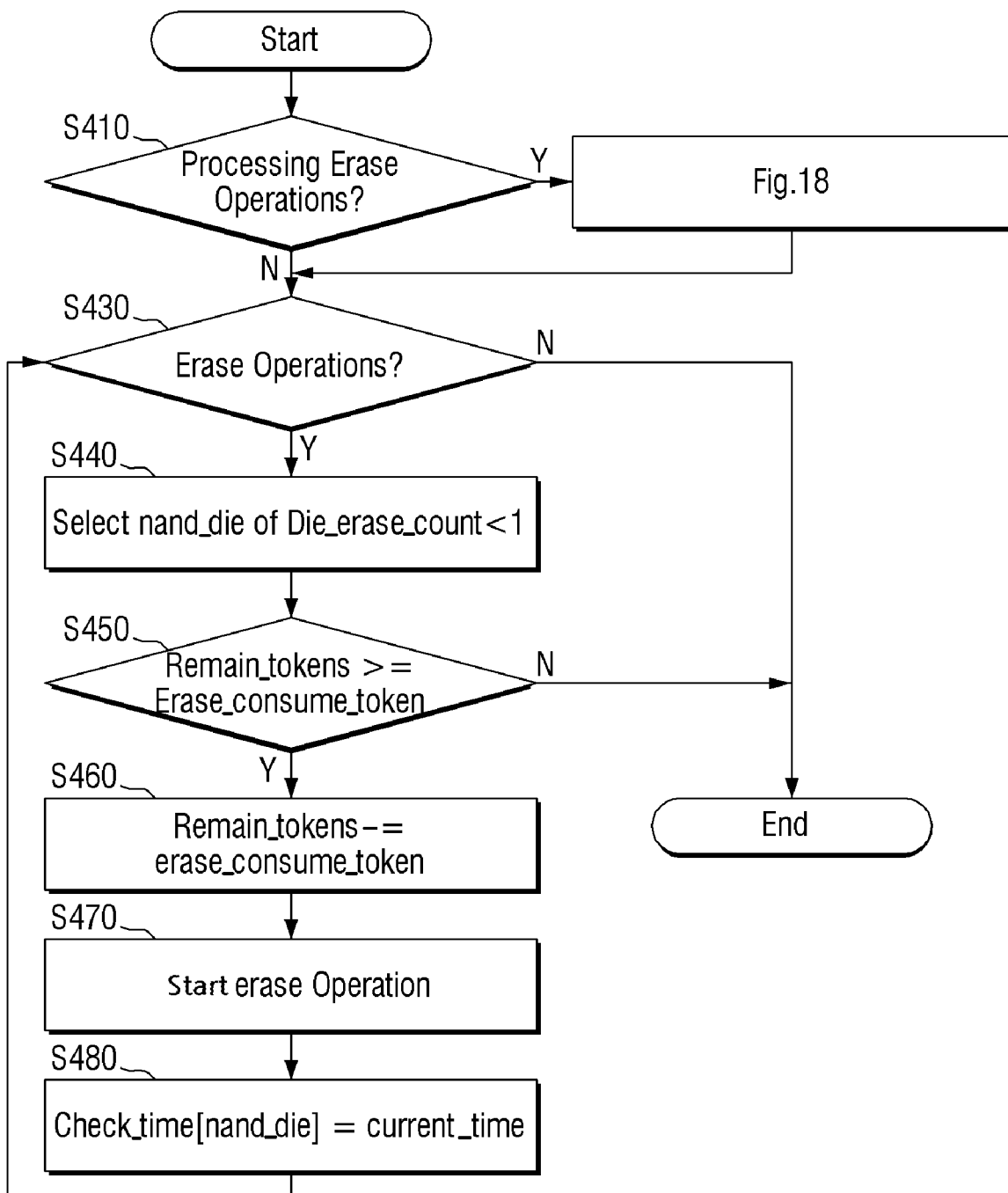
FIG. 17 and FIG. 18 are flowcharts for explaining the operation of a memory controller according to some other embodiments of the present disclosure.
Figure 18:
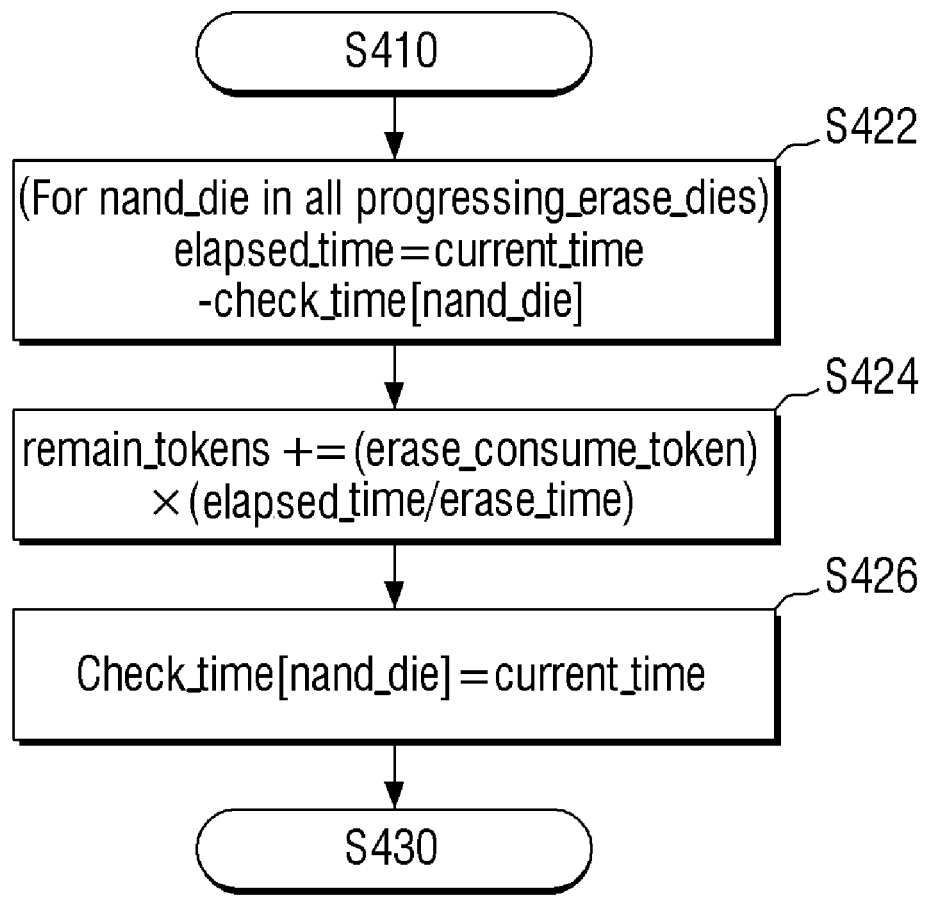

FIG. 17 and FIG. 18 are flow charts for explaining an operation of a memory controller according to other embodiments of the present disclosure.

Referring to FIG. 17 first, it is assumed that the program on the Nth super block and the erase on the N+1st super block are waiting in the queue.

It is checked whether the erase operations are being performed at S410.

If the erase operations are being performed (S410=Y), an elapsed time (elapsed_time) is calculated for all the dies in which the erase operations are being performed at S422 of FIG. 18. The elapsed time (elapsed_time) is calculated by subtracting the check time (check_time) from the current time (current_time).

Next, the number of remaining tokens (remain_tokens) (that is, total tokens) is calculated at S424 of FIG. 18.

The previous value of the remaining tokens (remain_tokens) is added to the number of tokens which increases in proportion to the elapsed time (elapsed_time) to determine the current value of the remaining tokens (remain_tokens).

Specifically, the number of increasing tokens may be a value obtained by multiplying the token (erase_consume_token) consumed at the same time as the start of erase by the ratio of the elapsed time (elapsed_time) and the erase time (erase_time). That is, if the token (erase consume_token) consumed at the same time as the start of erase is 10, the erase time (erase_time) is 25 ms, and the elapsed time (elapsed_time) is 5 ms, the number of increasing tokens is 2 (∴ 2=10×5/25).

Then, the current time (current_time) is recorded as the check time (check_time) at S426 of FIG. 18.

Refer to FIG. 17 again, it is checked whether there are remaining erases to be performed at S430.

If there are remaining erases to be performed (S340=Y), a die that has no record of performing the erase (that is, the erase count (die_erase_count) is smaller than 1) is selected at S440.

Next, it is checked whether the remaining tokens (total tokens) are equal to or larger than the consumed tokens (erase_consume_token) at S450.

If the remaining tokens are equal to or larger than the consumed tokens (S450=Y), the consumed tokens are subtracted from the initial values of the remaining tokens to calculate the current value of the remaining tokens at S460.

Next, the erase operation starts at S470.

Next, the current time (current_time) is recorded as the check time (check_time) at S480. Next, the process returns to S430.

On the other hand, if there are no remaining erases to be performed in step S430 (S430=N), or if the remaining tokens are smaller than the consumed tokens in step S450 (S450=N), the process ends.

On the other hand, although the method for performing the erase on the N+1st super block divided into multiple steps (see FIGS. 5 to 13), and the method for controlling so that the erase sections of dies overlap to the minimum (see FIGS. 14 to 18) have been explained, the methods may be used in combination with each other.

For example, although FIG. 6 shows that the erase section (N+1.first) of the first die DIE0 and the erase section (N+1.first) of the second die DIE0 belonging to the first step erase ERS1 overlap each other, the erase section (N+1.first) of the first die DIE0 and the erase section (N+1.first) of the second die DIE0 belonging to the first step erase ERS1 may only partially overlap or may not completely overlap each other. Or, the erase section (N+1.n) of the first die DIE0 and the erase section (N+1.n) of the second die DIE1 belonging to some other step erase (e.g., ERS4) may only partly overlap or may not completely overlap each other.

On the other hand, in some embodiments of the present disclosure, the maximum throughput (Max throughput) of the memory device 150 is larger than the Host Interface Max Write Throughput. Therefore, even if a large-capacity buffer memory is not adopted, the erase section may be controlled in the same manner as in the above-mentioned methods, and the solution throughput of the storage device 100 may be made as much as the maximum write throughput of the host interface.

Although examples of implementations relating to the inventive concept(s) described herein have been explained above referring to the attached drawings, the inventive concept(s) described herein are not limited to the examples and may be produced or otherwise manifested in various different forms. Those skilled in the art will appreciate that the examples may be implemented in other specific forms without changing the technical ideas and essential features of the inventive concept(s) described herein. Therefore, the disclosed preferred embodiments of the inventive concept(s) described herein are used in a generic and descriptive sense only and not for purposes of limitation.

What is claimed is:

1. A memory controller, comprising:
   an interface for communicating with a memory device which includes a first die and a second die, the first die including a first block and a second block, and the second die including a third block and a fourth block; and
   a control module which manages the memory device in units of a first super block and a second super block, the first super block including the first block and the third block, and the second super block including the second block and the fourth block,
   wherein the control module completes a program on the first super block and an erase on the second super block before starting the program on the second super block, and performs the erase on the second super block divided into multiple steps,
   completion of the program on the first super block and the erase on the second super block includes
      performing a first step erase of the second block, after programming a first portion of the first block,
      programming a second portion of the first block, after the first step erase of the second block, and
      performing a second step erase of the second block, after programming the second portion of the first block.

2. The memory controller of claim 1, wherein completion of the program on the first super block and the erase on the second super block includes
   performing a first step erase of the fourth block, after programming a third portion of the third block,
   programming a fourth portion of the third block, after the first step erase of the fourth block, and
   performing a second step erase of the fourth block, after programming the fourth portion of the third block.

3. The memory controller of claim 2, wherein a first step erase section of the second block and a first step erase section of the fourth block only partially overlap or do not overlap each other.

4. The memory controller of claim 1, further comprising:
   a first queue which stores program commands for the first die, and a second queue which stores erase commands for the first die and is different from the first queue.

5. The memory controller of claim 4, further comprising:
   a third queue which stores program commands for the second die, and a fourth queue which stores erase command for the second die and is different from the third queue.

6. The memory controller of claim 1, wherein performing of the first step erase of the second block includes
   performing the first step erase of the second block, when a current throughput of the first die is greater than a threshold throughput after programming the first portion of the first block.

7. The memory controller of claim 6, wherein programming of the second portion of the first block includes
   programming the second portion of the first block, when the current throughput of the first die becomes equal to or smaller than the threshold throughput during the first step erase.

8. The memory controller of claim 1, wherein when the program of the first block is performed, a current throughput of the first die increases, and when the erase of the second block is performed, the current throughput of the first die decreases, and
   completion of the program on the first super block and the erase on the second super block includes
   alternately performing the program on the first block and the erase on the second block to control so that the current throughput of the first die is located between a threshold throughput and a maximum throughput.

9. The memory controller of claim 1, wherein a first duration of the first step erase is shorter than a second duration of the second step erase.

10. The memory controller of claim 9, further comprising:
   programming a third portion of the first block after the second step erase of the second block; and
   performing a third step erase of the second block after programming the third portion of the first block,
   wherein the second duration of the second step erase is longer than a third duration of the third step erase.

11. The memory controller of claim 9, wherein when the program on the first block is performed, a current throughput of the first die increases, and when the erase on the second block is performed, the current throughput of the first die decreases, the control module sets a first maximum throughput corresponding to the first portion of the first block and a second maximum throughput corresponding to the second portion of the first block so that the second maximum throughput is higher than the first maximum throughput, when the first portion of the first block is programmed, the current throughput of the first die becomes the first maximum throughput, and when the second block starts the first step erase, the current throughput of the first die decreases from the first maximum throughput, and when the second portion of the first block is programmed, the current throughput of the first die becomes the second maximum throughput, and when the second block starts the second step erase, the current throughput of the first die decreases from the second maximum throughput.

12. The memory controller of claim 1, wherein a maximum throughput of the memory device is larger than a host interface max write throughput.

13. A memory device, comprising:
a first die including a first block and a second block; and
a second die including a third block and a fourth block,
wherein the memory device is controlled in units of a first super block and a second super block, the first super block including the first block and the third block, and the second super block including the second block and the fourth block,
before starting a program on the second super block, a program on the first super block and an erase on the second super block are completed, and the erase on the second super block is performed divided into multiple steps,
completion of the program on the first super block and the erase on the second super block includes
performing a first step erase of a second block, after programming a first portion of the first block,
programming a second portion of the first block, after the first step erase of the second block, and
performing a second step erase of the second block, after programming the second portion of the first block.

14. The memory device of claim 13, wherein a first duration of the first step erase is shorter than a second duration of the second step erase.

15. A storage device, comprising:
a memory device which includes a first die and a second die, the first die including a first block and a second block, and the second die including a third block and a fourth block; and
a controller which manages the memory device by a first super block or a second super block, the first super block including the first block and the third block, and the second super block including the second block and he fourth block,
wherein the controller completes a program on the first super block and an erase on the second super block before starting the program on the second super block, and performs the erase on the second super block divided into multiple steps, and
the program on the first super block and the erase on the second super block include
performing a first step erase of a second block, after programming a first portion of the first block, programming a second portion of the first block, after the first step erase of the second block, and
performing a second step erase of the second block, after programming the second portion of the first block.

16. The storage device of claim 15, wherein the program on the first super block and the erase on the second super block include
performing the first step erase of the fourth block, after programming a third portion of the third block,
programming a fourth portion of the third block, after the first step erase of the fourth block, and
performing the second step erase of the fourth block, after programming the fourth portion of the third block, and
a first step erase section of the second block and a first step erase section of the fourth block only partially overlap or do not overlap each other.

17. The storage device of claim 15, wherein the controller further comprises:
a first queue which stores a program command for the first die, and a second queue which stores an erase command for the first die and is different from the first queue,
wherein the controller checks the program command and the erase command and performs a scheduling operation.

18. The storage device of claim 15, wherein the first step erase of the second block includes the first step erase of the second block, when a current throughput of the first die is greater than a threshold throughput after programming the first portion of the first block, and
programming the second portion of the first block includes programming the second portion of the first block, when the current throughput of the first die becomes equal to or smaller than the threshold throughput, during the first step erase.

19. The storage device of claim 15, wherein the controller further comprises:
programming a third portion of the first block, after the second step erase of the second block, and
performing a third step erase of the second block, after programming the third portion of the first block, and
a second duration of the second step erase is longer than a first duration of the first step erase and a third duration of the third step erase.

20. The storage device of claim 15, wherein when the program on the first block is performed, a current throughput of the first die increases, and when the erase on the second block is performed, the current throughput of the first die decreases,
a control module sets a first maximum throughput corresponding to the first portion of the first block, and a second maximum throughput corresponding to the second portion of the first block so that the second maximum throughput is higher than the first maximum throughput,
when the first portion of the first block is programmed, the current throughput of the first die becomes the first maximum throughput, and when the second block starts the first step erase, the current throughput of the first die decreases from the first maximum throughput, and
when the second portion of the first block is programmed, the current throughput of the first die becomes the second maximum throughput, and when the second block starts the second step erase, the current throughput of the first die decreases from the second maximum throughput.

\* \* \* \* \*